(12) United States Patent
Choi et al.

(10) Patent No.: US 6,855,575 B2
(45) Date of Patent: Feb. 15, 2005

(54) SEMICONDUCTOR CHIP PACKAGE HAVING A SEMICONDUCTOR CHIP WITH CENTER AND EDGE BONDING PADS AND MANUFACTURING METHOD THEREOF

(75) Inventors: Ill Heung Choi, Chungcheongnam-do (KR); Young Hee Song, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/202,764

(22) Filed: Jul. 24, 2002

(65) Prior Publication Data

US 2002/0185751 A1 Dec. 12, 2002

Related U.S. Application Data

(62) Division of application No. 09/886,524, filed on Jun. 20, 2001, now Pat. No. 6,445,077.

(30) Foreign Application Priority Data

Jun. 23, 2000 (KR) ........................................ 2000-34820

(51) Int. Cl.[7] .............................................. H01L 23/48
(52) U.S. Cl. ...................... 438/108; 438/118; 438/124; 257/790; 257/778; 257/692; 257/680; 174/52.2; 174/260
(58) Field of Search ................................. 438/108, 106, 438/118, 123, 124; 29/740, 748; 174/52.2, 251, 255, 260, 261; 257/666, 692, 738, 778, 787, 668, 680, 788, 790

(56) References Cited

U.S. PATENT DOCUMENTS

| | | | |
|---|---|---|---|
| 4,996,587 A | * 2/1991 | Hinrichsmeyer et al. ...... 357/74 |
| 5,159,434 A | 10/1992 | Kohno et al. ................ 257/668 |
| 5,428,247 A | 6/1995 | Sohn et al. .................. 257/664 |
| 5,674,785 A | * 10/1997 | Akram et al. ................ 437/217 |
| 5,677,566 A | * 10/1997 | King et al. .................. 257/666 |
| 5,864,470 A | 1/1999 | Shim et al. .................. 174/254 |
| 5,894,107 A | * 4/1999 | Lee et al. .................... 174/52.2 |
| 5,986,346 A | 11/1999 | Katoh ......................... 257/698 |
| 5,999,413 A | 12/1999 | Ohuchi et al. .............. 174/260 |
| 6,013,946 A | 1/2000 | Lee et al. .................... 257/666 |
| 6,060,768 A | 5/2000 | Hayashida et al. ......... 257/666 |
| 6,104,089 A | 8/2000 | Akram ........................ 257/679 |
| 6,122,171 A | 9/2000 | Akram et al. ............... 165/185 |
| 6,218,202 B1 | 4/2001 | Yew et al. ..................... 257/48 |
| 6,221,682 B1 | 4/2001 | Danziger et al. ........... 438/108 |
| 6,252,298 B1 | 6/2001 | Lee et al. .................... 257/650 |
| 6,265,768 B1 | 7/2001 | Su et al. ...................... 257/684 |
| 6,271,586 B1 | 8/2001 | Shen ........................... 257/690 |
| 6,291,884 B1 | 9/2001 | Glenn et al. ................ 257/747 |
| 6,331,451 B1 | 12/2001 | Fusaro et al. ............... 257/702 |

* cited by examiner

*Primary Examiner*—Ernest Karlsen
*Assistant Examiner*—Lourdes Cruz
(74) *Attorney, Agent, or Firm*—Harness, Dickey & Pierce, P.L.C.

(57) ABSTRACT

A method for manufacturing a semiconductor chip package includes: preparing a semiconductor chip having center and edge bonding pads and a substrate, which includes a first window, a second window, connection pads, external terminal pads, and a wiring pattern; attaching the semiconductor chip on the substrate such that the first window exposes the center bonding pads and the second window exposes the edge bonding pads; connecting the first and second bonding pads to corresponding connection pads; encapsulating side surfaces of the semiconductor chip, a portion of the bottom surface of the substrate, the bonding wires, and the connection pads; and forming external terminals on the external terminal pads of the substrate. The encapsulating includes a first encapsulation of the side surfaces of the semiconductor chip and a portion of the bottom surface of the substrate and a second encapsulation of the bonding wires and the connection pads.

7 Claims, 6 Drawing Sheets

SEMICONDUCTOR CHIP PACKAGE HAVING A SEMICONDUCTOR CHIP WITH CENTER AND EDGE BONDING PADS AND MANUFACTURING METHOD THEREOF

CROSS REFERENCE TO RELATED APPLICATION

The present application is a division of U.S. patent application Ser. No. 09/886,524 filed Jun. 20, 2001, now U.S. Pat. No. 6,445,077 incorporated herein by reference.

BACKGROUND OF THE INVENTION

The present invention is directed to a semiconductor chip package for a semiconductor chip with center and edge bonding pads and a manufacturing method of such semiconductor chip package.

Plastic package, in which a semiconductor chip is attached to a leadframe and encapsulated with a molding compound, is not effective in decreasing the footprint and the profile of the package. Accordingly, to implement a small-footprint and low profile semiconductor device, semiconductor packaging techniques using a PCB (Printed Circuit Board) or a tape instead of the leadframe have been developed. An example of the newly developed packages is a BGA (Ball Grid Array) package. The BGA package has a semiconductor chip mounted and connected to a PCB, and then encapsulated. External terminals, such as solder balls, are attached to the other side of the PCB, so that bonding pads of the semiconductor chip connect to corresponding external terminals. A smaller version of the BGA package is called a fine pitch BGA.

FIG. 1 is a cross-sectional view of a conventional fine pitch BGA package 110. In fine pitch BGA package 110, beam leads 122 of a tape 121 connect to bonding pads 112 of a semiconductor chip 111. (only one of bonding pads 112 are shown in FIG. 1.) An elastomer 125 is interposed between semiconductor chip 111 and tape 121, and a molding part 135 serves to protect semiconductor chip 111 and beam leads 122 from the external impact. Solder balls 137 are attached to tape 121, and thereby electrically connected to corresponding bonding pads 112 of semiconductor chip 111.

Semiconductor chip 111 has its bonding pads the center of semiconductor chip 111. However, when more bonding pads are necessarily to be formed on a semiconductor chip, the bonding pads can be formed along both the center and edges of the semiconductor chip. Semiconductor chip package 110 cannot package a semiconductor chip having both center and edge bonding pads. Accordingly, a semiconductor chip package that can package such semiconductor chip needs to be developed.

SUMMARY OF THE INVENTION

In accordance with an aspect the present invention, a semiconductor chip package includes a semiconductor chip and a substrate on which the semiconductor chip attaches. The semiconductor chip includes center bonding pads formed on a surface of the semiconductor chip in a central area of the surface and edge bonding pads formed along edges of the surface of the semiconductor chip. The substrate includes a first window that exposes the center bonding pads, a second window that exposes the edge bonding pads, connection pads around the first and second windows, external terminal pads, and a wiring pattern that connects the connection pads to the external terminal pads.

The semiconductor chip package further includes bonding wires, an encapsulation body, and external terminals formed on the external terminal pads of the substrate. The bonding wires connect the center and edge bonding pads of the semiconductor chip to the connection pads of the substrate. The encapsulation body encapsulates side surfaces of the semiconductor chip, a portion of the bottom surface of the substrate, the bonding wires, and the connection pads. The encapsulation body includes a first encapsulation portion and a second encapsulation portion. The first encapsulation portion encapsulates the side surfaces of the semiconductor chip and the portion of the bottom surface of the substrate, and the second encapsulation portion encapsulates the bonding wires and the connection pads.

In the package, the center bonding pads can be aligned in parallel with or in perpendicular to the edge bonding pads. In addition, the first and second windows can be integrated into a single window.

Another aspect of the invention provides a method for manufacturing a semiconductor chip package. The method includes: preparing a semiconductor chip having center bonding pads and edge bonding pads; preparing a substrate, which includes a first window, a second window, connection pads around the first and second windows, external terminal pads, and a wiring pattern; attaching the semiconductor chip on the substrate such that the first window exposes the center bonding pads and the second window exposes the edge bonding pads; connecting the first and second bonding pads of the semiconductor chip to corresponding connection pads of the substrate; encapsulating side surfaces of the semiconductor chip, a portion of the bottom surface of the substrate, the bonding wires, and the connection pads; and forming external terminals on the external terminal pads of the substrate.

The encapsulating includes a first encapsulation of the side surfaces of the semiconductor chip and a portion of the bottom surface of the substrate and a second encapsulation of the bonding wires and the connection pads. The first encapsulation is performed by potting. The second encapsulating is performed by potting or by transfer-molding.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION

Figure 1:
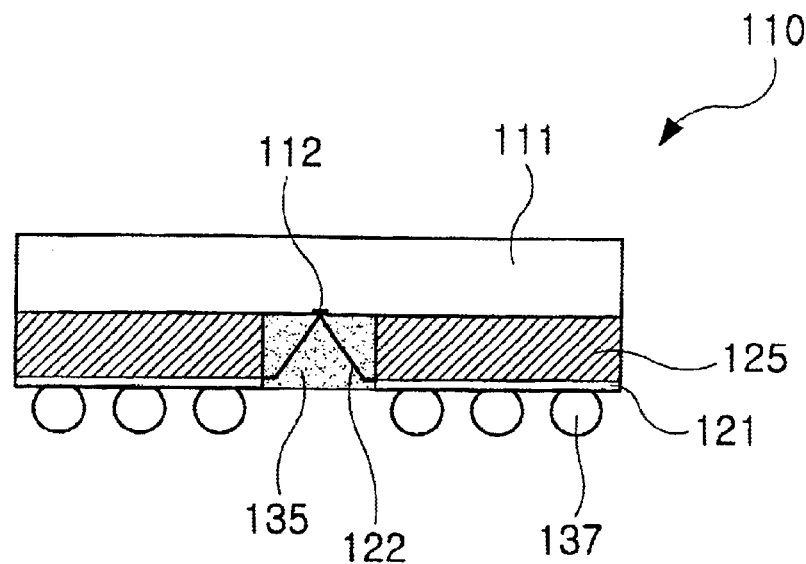
FIG. 1 is a cross-sectional view of a conventional fine pitch BGA.
Figure 2:
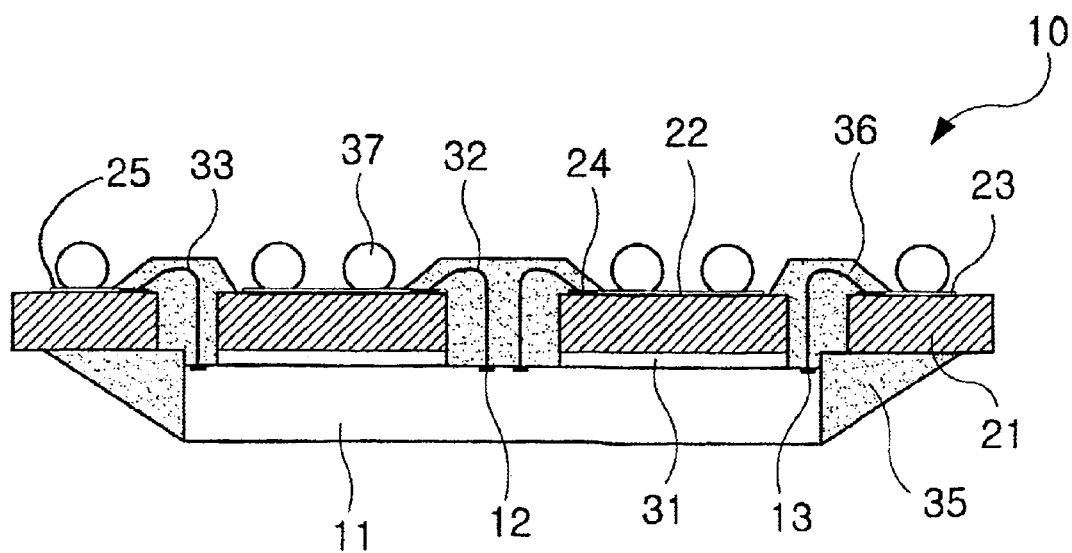
FIG. 2 is a cross-sectional view taken along line A—A of FIG. 3, of a semiconductor chip package in accordance with an embodiment of the present invention.
Figure 3:
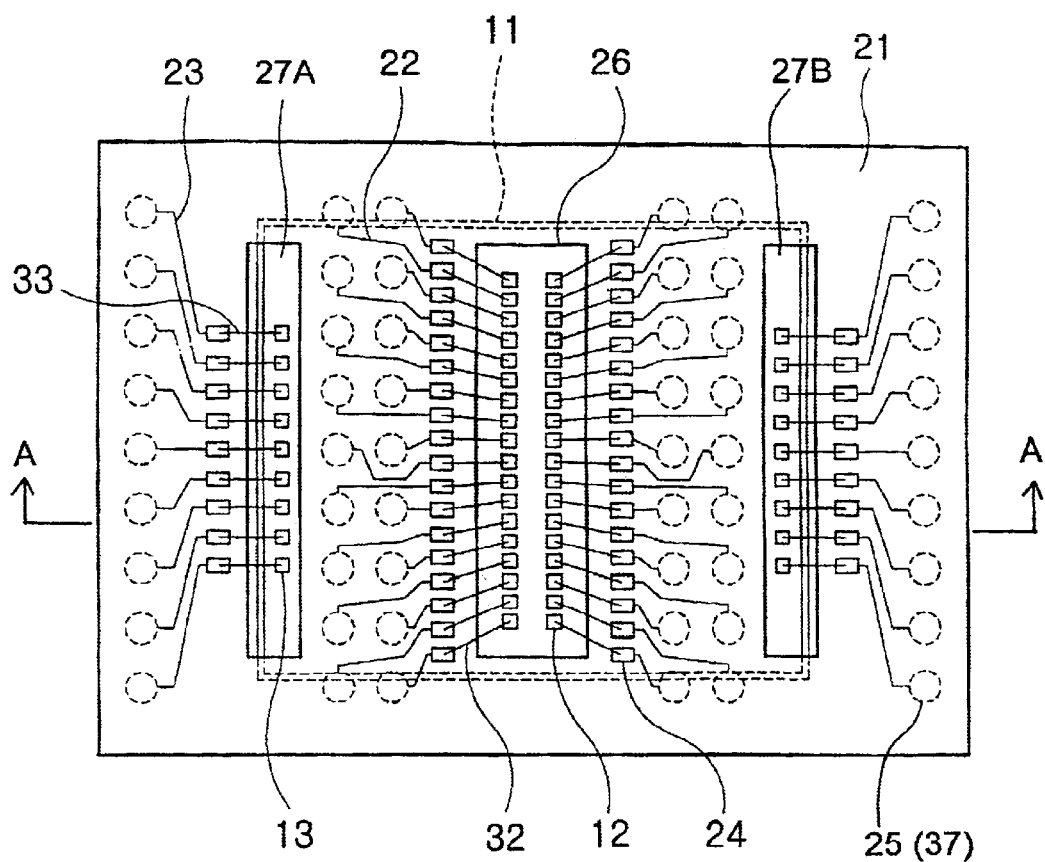
FIG. 3 is a plan view of the semiconductor chip package of FIG. 2 before encapsulation.

FIG. 2 is a cross-sectional view of a semiconductor chip package 10 in accordance with an embodiment of the present invention, and FIG. 3 is a plan view of semiconductor chip package 10 before encapsulation. Semiconductor chip package 10 includes a semiconductor chip 11 having center bonding pads 12 and edge bonding pads 12. Center bonding pads 12 are in two rows along the center of semiconductor chip 11, and edge bonding pads 13 are along the edges of semiconductor chip 11.

Semiconductor chip package 10 further includes a substrate 21 on which semiconductor chip 11 is attached using an adhesive tape 31, which is made of a polyimide tape. Substrate 21, which is a printed circuit board or a printed circuit tape, has a number of windows 26, 27A, and 27B, circuit patterns 22 and 23, connection pads 24, external terminal pads 25. Window 26 is formed such that center bonding pads 12 are exposed through window 25 when semiconductor chip 11 is attached to substrate 21. Windows 27A and 27B are formed such that edge bonding pads 13 are exposed through windows 27A and 27B when semiconductor chip 11 is attached to substrate 21. Connection pads 24 are around windows 26, 27A, and 27B so that bonding wires 32 and 33 can connect bonding pads 12 and 13 to corresponding connection pads 24. Circuit patterns 22 and 23 connect external terminal pads 25, to which solder balls (or external terminals) 37 are attached, to corresponding connection pads 24. Accordingly, solder balls 37 electrically connect to corresponding bonding pads 12 and 13.

The semiconductor package 10 includes a first molding part 35 and a second molding part 36. First molding part 35 is around the perimeter of semiconductor chip 11 so as to protect the edges of semiconductor chip 11. Second molding part 36encapsulates the portions of semiconductor chip 11 exposed through windows 26, 27A, and 27B and bonding wires 32 and 33. The height of second molding part 36 is smaller than that of solder balls 37.

As described above, semiconductor chip package 10 packages semiconductor chip 11 having both center bonding pads 12 and edge bonding pads 13. A semiconductor chip with center and edge bonding pads can be designed to have more functionality and higher operation speed than a semiconductor chip only with center bonding pads.

Figure 4:
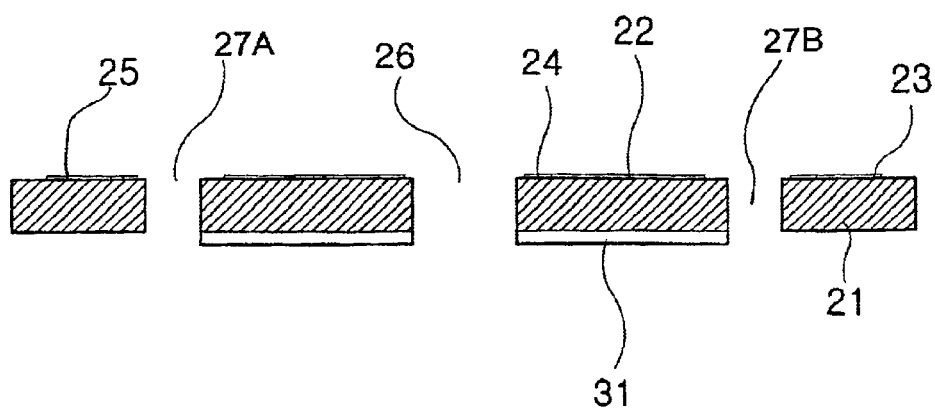
FIG. 4 through FIG. 8 are cross-sectional views a semiconductor, illustrating steps of a method for manufacturing the semiconductor chip package of FIG. 3.
Figure 5:
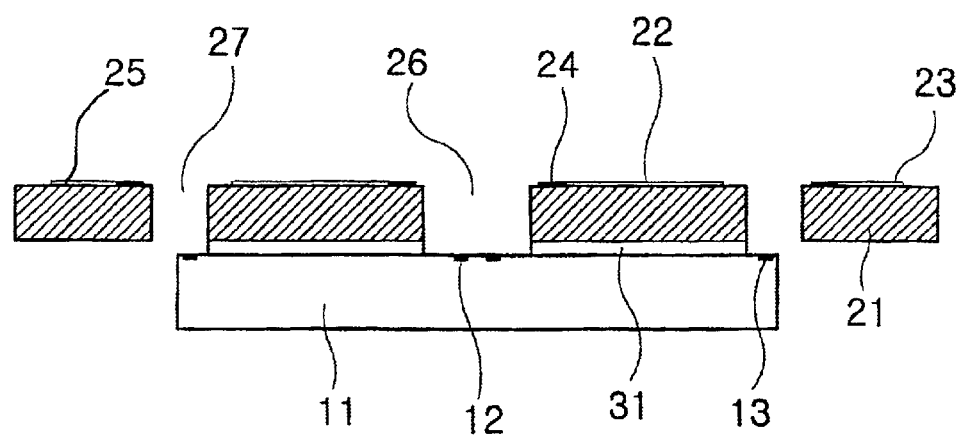

FIG. 4 through FIG. 8 illustrate the steps of manufacturing semiconductor chip package 10 in accordance with another embodiment of the present invention. Referring to FIG. 4, substrate 21 having windows 26, 27A, and 27B, circuit wirings 22 and 23, connection pads 24, and external terminal pads 25 is prepared. Then, adhesive tape 31 is attached to the surface of substrate 21 that is opposite to the surface having circuit wirings 22 and 23, connection pads 24, and external terminal pads 25. Window 26 is formed at the center of substrate 21, and windows 27A and 27B are formed at the both outer sides of the substrate 21. Window 26 corresponds to center bonding pads 12 (FIG. 5), and windows 27A and 27B correspond to edge bonding pads 13 (FIG. 5). Connection pads 24 are formed around windows 26, 27A, and 27B, and circuit wirings 22 and 23 are electrically connected to connection pads 24. Each of connection pads 24 has a sufficient width and dimension for the wire bonding.

As shown in FIG. 5, semiconductor chip 11 is mounted on substrate 21, so that the surface of semiconductor chip 11 having center bonding pads 12 and edge bonding pads 13 is attached via adhesive tape 31 to the surface (bottom surface) of substrate 21 that is opposite to the surface (top surface) on which circuit wirings 22 and 23 are. After the attachment, center bonding pads 12 are exposed through window 26, and edge bonding pads 13 are exposed windows 27A and 27B.

Portions of edges of semiconductor chip 11 are also can be exposed through windows 27A and 27B.

Figure 6:
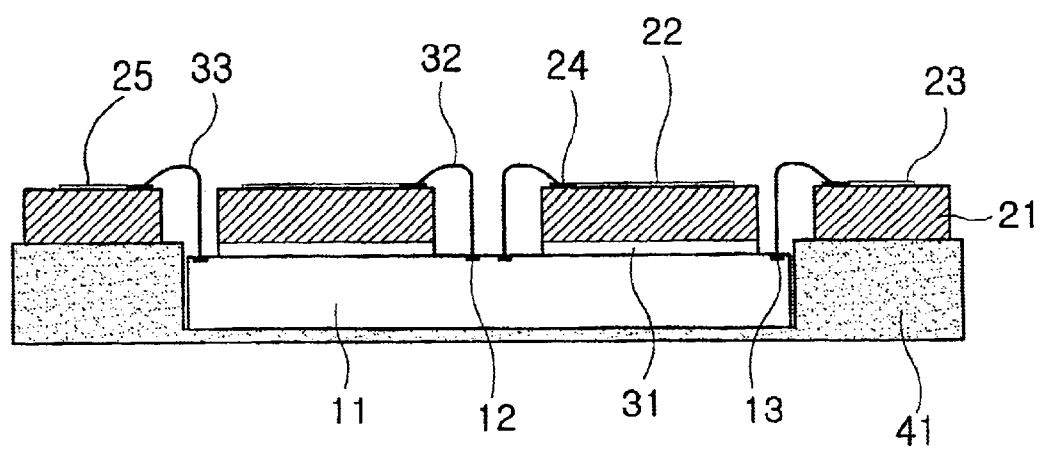

After the attachment of semiconductor chip 11 to substrate 11; as shown in FIG. 6, bonding pads 12 and 13 are electrically connected to corresponding connection pads 24 by wire bonding. That is, center bonding pads 12 are wire-bonded to connection pads 24 around window 26, and edge bonding pads 13 are wire-bonded to connection pads 24 around windows 27A and 27B. Since connection pads 24 is close to windows 26, 27A, and 27B, the lengths of the bonded wires 32 and 33 are short. Further, since bonding wires 32 and 33 connect between connection pads 24 and connection pads 12 and 13 that are below connection pads 24, the heights of wire loops are low.

Figure 7:
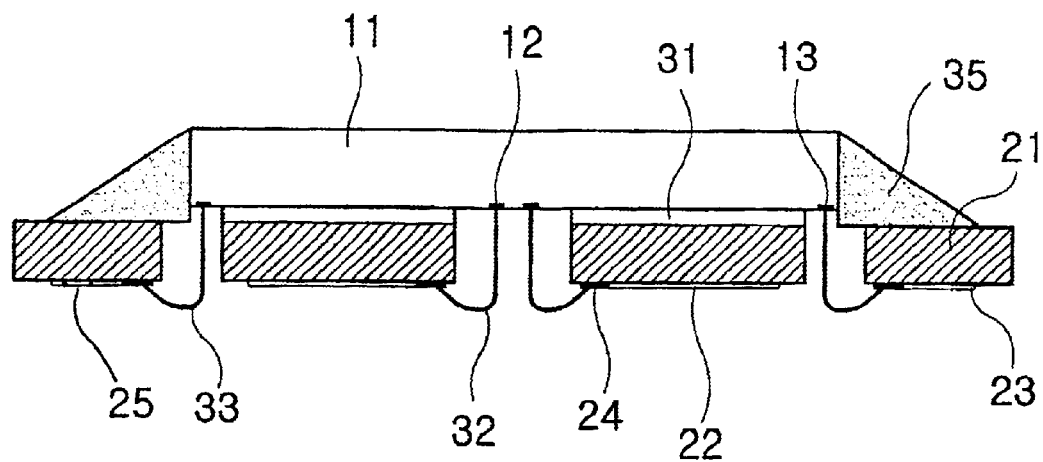

Referring to FIG. 7, after the wire-bonding a first molding part 35 is formed to protect the side surfaces of semiconductor chip 11 and the bottom surface of substrate 21. First molding part 35 serves to prevent overflowing of an encapsulant in forming a second molding part 36 (FIG. 8) as well as to protect the side surfaces of semiconductor chip 11 and substrate 21. First molding part 35 can be formed by potting an encapsulant with an optimum viscosity around semiconductor chip 11. The gap between the side surfaces of the semiconductor chip and adjacent edges of window 27A and 27B should be very small, so that the encapsulant does not overflow through the gap.

Figure 8:
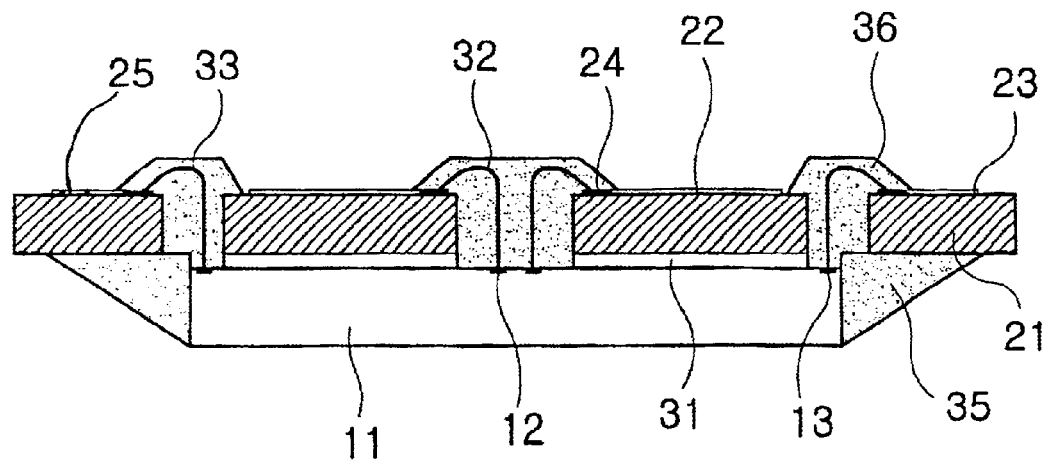

FIG. 8 illustrates the formation of second molding part 36 that encapsulates bonding wires 32 and 33, connection pads 24, and the surfaces of semiconductor chip 11 exposed through windows 26, 27A, and 27B. A known transfer-molding or potting of an encapsulant can form second molding part 36.

Then, as shown in FIG. 2, solder balls 37 are attached to external terminal pads 25. The height of solder balls 37 is uniform and greater than the height of second molding part 36, such that the semiconductor chip package is mounted through solder balls 37 on a mother board.

Although in the above-described embodiment, the row of the center bonding pads and the row of the edge bonding pads are disposed in parallel, the rows can be disposed in a different fashion, and window can be formed accordingly. That is, semiconductor chips having many variations or modifications of the arrangement of the center and the edge bonding pads may be used, and the windows may vary in shape, location, and number.

Figure 9:
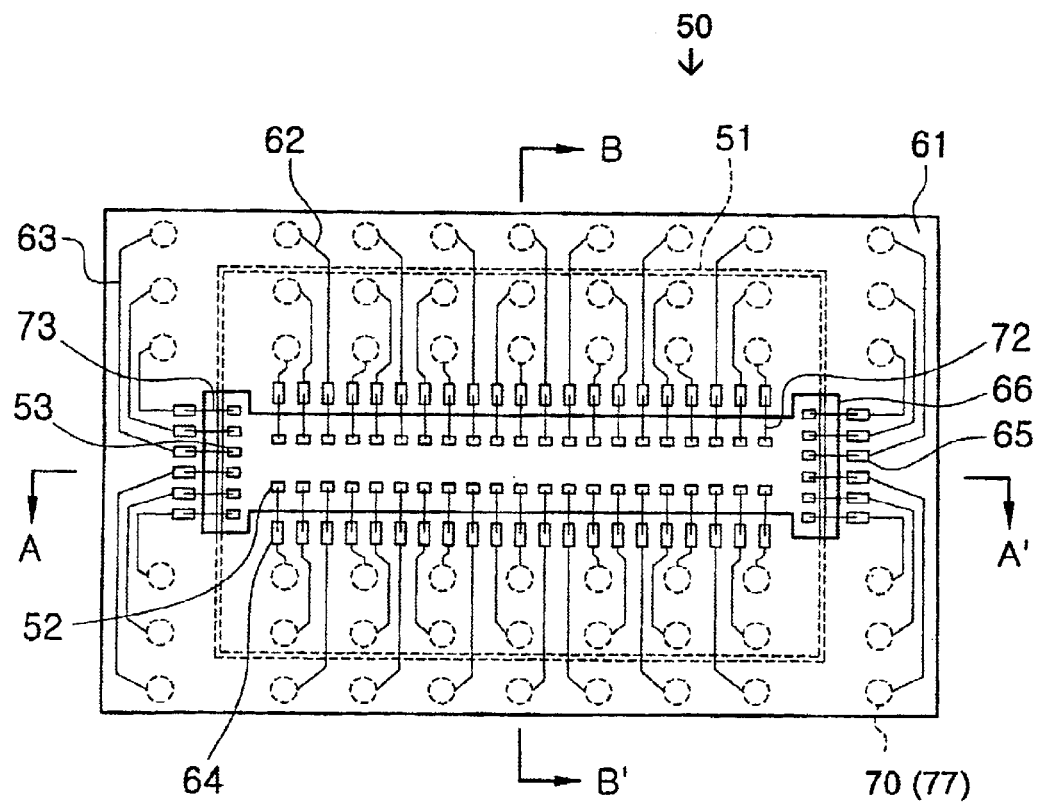
FIG. 9 is a plan view of a semiconductor chip package before encapsulation in accordance with another embodiment of the present invention.
Figure 10:
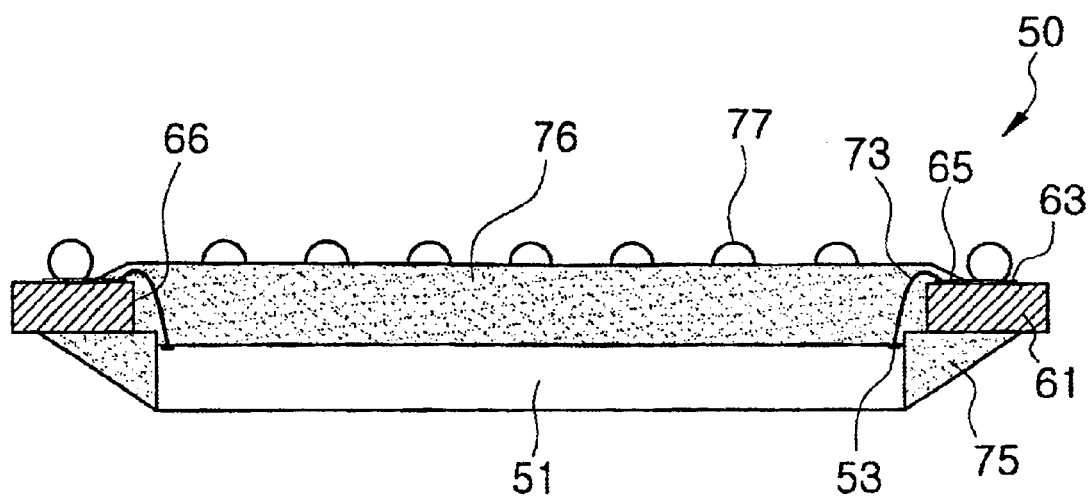
FIG. 10 is a cross-sectional view taken along the line A–A' of FIG. 9 after encapsulation.

FIG. 9 is a plan view showing a semiconductor chip package 50 before encapsulation in accordance with another embodiment of the present invention. FIG. 10 is a cross-sectional view of semiconductor chip package 50 after molding taken along the line A–A' of FIG. 9, and FIG. 11 is a cross-sectional view of semiconductor chip package 50 after molding taken along the line B–B' of FIG. 9.

Figure 11:
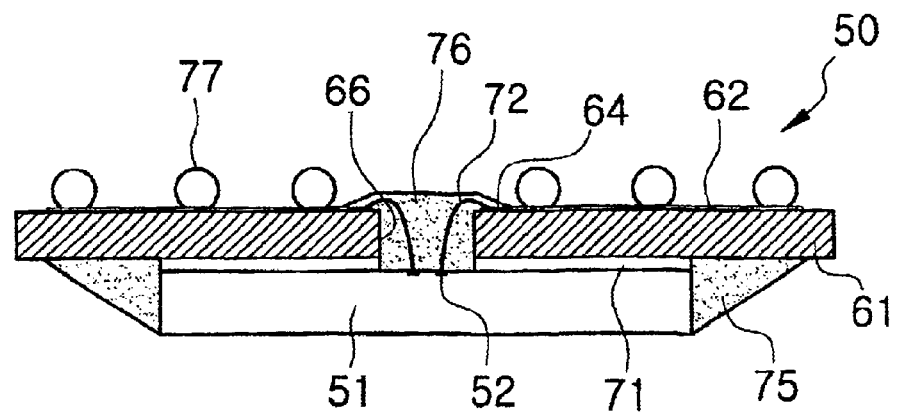
FIG. 11 is a cross-sectional view taken along the line B–B' of FIG. 9 after encapsulation.

Referring to FIG. 9 through FIG. 11, semiconductor chip package 50 employs a semiconductor chip 51 having combined bonding pads composed of center bonding pads 52 and edge bonding pads 53. Herein, center bonding pads 52 are disposed in two longitudinal rows along the center of semiconductor chip 51, edge bonding pads 53 are disposed in a row along the shorter edges of semiconductor chip 51. Accordingly, the direction of center bonding pads 52 is perpendicular to the direction of edge bonding pads 53. External terminal pads 70 for attaching solder balls 77 and wirings 62 and 63 are formed on substrate 61. Wirings 62 connects connection pads 64 to corresponding external terminal pads 70, and wirings 63 connects connection pads 65 to corresponding external terminal pads 70. A window 66 is formed through substrate 61 so as to expose bonding pads 52 and 53, and connection pads 64 and 65 are formed on substrate 61 around window 66. Connection pads 64 correspond to center bonding pads 52, and connection pads 65 correspond to edge bonding pads 53. Semiconductor chip 51 is attached to substrate 61 with an adhesive tape 71. Portions of shorter edges of semiconductor chip 51 can be disposed through window 66.

After semiconductor chip 51 is attached to substrate 61, bonding pads 52 and 53 are connected through bonding wires 72 and 73 to corresponding connection pads 64 and 65. Then, a first molding part 75 encapsulates side surfaces of semiconductor chip 51 and the bottom surface of substrate 61, and a second molding part 76 encapsulates bonding wires 72 and 73, connection pads 64 and 65, and the surface of semiconductor chip 51 exposed through window 66. First and second molding parts 75 and 76 can be formed in the same way first and second molding parts 35 and 36 of FIGS. 7 and 8 are formed. Solder balls 37 are attached to external terminal pads 70 and functions as external terminals of semiconductor chip package 50. Solder balls 77 are electrically connected to connection pads 64 and 65 via wirings 62 and 63, and have a height greater than that of second molding part 76.

Although printed circuit boards are preferred for the substrates of the semiconductor chip packages of the present invention, other flexible tapes having circuit wirings, such a TAB (tape-automated bonding) tape, may be employed. When the TAB tape is used, a gang bonding of the beam leads of the tape to the bonding pads of the semiconductor will replace the wire-bonding described above. In addition, instead of the solder balls, other components, such as solder columns, can be used.

The semiconductor chip packages of the present invention enable high integration of semiconductor chips by providing a freedom in placing bonding pads on semiconductor chips and can increase the number of I/O terminals of the semiconductor chip without increasing the size of the chip.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A method for manufacturing a semiconductor chip package, the method comprising:

preparing a semiconductor chip having a plurality of center bonding pads formed on a surface of the semiconductor chip in a central area of the surface and a plurality of edge bonding pads formed along edges of the surface of the semiconductor chip;

preparing a substrate comprising:
 a first window;
 a second window;
 a plurality of connection pads around the first and second windows on a top surface of the substrate;
 a plurality of external terminal pads on the top surface; and
 a wiring pattern that connects the connection pads to the external terminal pads;

attaching the semiconductor chip on a bottom surface of the substrate such that the first window exposes the center bonding pads and the second window exposes the edge bonding pads;

connecting the first and second bonding pads of the semiconductor chip to corresponding connection pads of the substrate;

encapsulating side surfaces of the semiconductor chip, a portion of the bottom surface of the substrate, the bonding wires, and the connection pads; and forming external terminals on the external terminal pads of the substrate.

2. The manufacturing method in claim 1, wherein the encapsulating comprises:

encapsulating first the side surfaces of the semiconductor chip and a portion of the bottom surface of the substrate; and encapsulating second the bonding wires and the connection pads.

3. The manufacturing method in claim 2, wherein the first encapsulating is performed by potting an encapsulant.

4. The manufacturing method in claim 2, wherein the second encapsulating is performed by potting an encapsulant.

5. The manufacturing method in claim 2, wherein the second encapsulating is performed by a transfer-molding.

6. The manufacturing method in claim 1, wherein the connecting the first and second bonding pads to the corresponding connection pads is performed by wire-bonding.

7. The manufacturing method in claim 1, wherein the first and second windows are integrated into a single window.

* * * * *